United States Patent [19]

Olson et al.

[11] Patent Number: 4,792,929

[45] Date of Patent: Dec. 20, 1988

[54] DATA PROCESSING SYSTEM WITH EXTENDED MEMORY ACCESS

[75] Inventors: Anthony M. Olson, Stevensville; Babu Rajaram, St. Joseph, both of Mich.

[73] Assignee: Zenith Electronics Corporation, Glenview, Ill.

[21] Appl. No.: 29,299

[22] Filed: Mar. 23, 1987

[51] Int. Cl.$^4$ ........................... G11C 8/00; G11C 7/00
[52] U.S. Cl. ..................................... 365/233; 365/193; 365/230
[58] Field of Search ................ 365/230, 233, 193, 189

[56] References Cited

U.S. PATENT DOCUMENTS

| | | | |
|---|---|---|---|
| 4,322,825 | 3/1982 | Nagami | 365/233 |
| 4,602,353 | 7/1986 | Wawersig et al. | 365/193 |
| 4,707,811 | 11/1987 | Takemae et al. | 365/233 |

FOREIGN PATENT DOCUMENTS

| | | | |
|---|---|---|---|
| 61-32291 | 2/1986 | Japan | 365/193 |
| 2127596 | 4/1984 | United Kingdom | 365/233 |

Primary Examiner—Stuart N. Hecker
Assistant Examiner—Alfonso Garcia

[57] ABSTRACT

A data processing system includes a plurality of memory access devices, each having a characteristic operating speed, for writing data into and reading data from a dynamic random access memory (DRAM) as well as a memory controller for accessing a plurality of addressable storage locations in the DRAM for either storing data in or reading stored data from the various storage locations in the DRAM. The system further includes a dynamic column address strobe (CAS) signal generator responsive to a memory access cycle signal, or READ pulse, and a conventional CAS signal for generating a dynamic CAS signal having a floating trailing edge which extends to the end of the memory access cycle as well as to the trailing edge of the READ pulse irrespective of the length of the memory access cycle signal to allow data to be read from the DRAM by any memory access device regardless of its operating speed during a memory access signal without losing or temporarily storing this data prior to providing it to the memory access device.

6 Claims, 1 Drawing Sheet

DATA PROCESSING SYSTEM WITH EXTENDED MEMORY ACCESS

BACKGROUND OF THE INVENTION

This invention relates generally to data processing systems including a central processor unit (CPU) and a random access memory (RAM) and is particularly directed to an arrangement for directly reading data from a dynamic random access memory (DRAM) to the CPU up to the end of a memory access cycle regardless of the length of the cycle.

In data processing systems, the CPU typically gains access to the system's RAM by asserting a READ or WRITE pulse for respectively reading data already stored in the RAM or storing new data in the RAM. The READ/WRITE pulse is frequently asserted early in the RAM access cycle and terminates at the end of the cycle such that valid data may be transmitted between the CPU and RAM up to the end of the access cycle. Moreover, the transfer of data between the CPU and RAM may be asynchronous such that the data may be transmitted at any time during the access cycle and may take place only over a very short period of time or may last for a substantial portion of the cycle, even extending beyond the end of a cycle.

A memory controller is typically provided in such data processing systems for generating control signals in response to the output of a READ/WRITE pulse from a processor such as a CPU or a direct memory access (DMA) controller. Addresses are generated in the processor to access a predetermined data storage location in the RAM. The organization of the RAM is typically in the form of a matrix, with each data storage location identified by a unique combination of a row address and a column address. A row address strobe (RAS) signal and a column address strobe (CAS) signal are provided to the RAM and function as enabling clock signals for introducing row and column address information into the RAM. More specifically, in the case of dynamic random access memories (DRAMs), the CAS signal latches column address information into the DRAM on its active going edge. Once the CAS signal is active, it serves as an output enable for the DRAM during a read cycle. Most DRAMs are specified such that when the CAS signal goes inactive in a read cycle, the data output from it can go invalid immediately.

DRAMs are used in many applications because of their large memory capacity, high operating speeds, and low cost. In spite of these advantages, problems have been encountered in data transfer systems employing a DRAM. For example, where memory access is asynchronous and valid data is provided to the end of the memory access cycle, the READ or WRITE pulse cannot be used to directly generate the RAS or CAS pulse for the DRAM because the minimum time between the end of a first READ/WRITE pulse and the start of a second, or next, READ/WRITE pulse may be less than the precharge time required by the DRAM. The DRAM's precharge time represents the time interval after the address strobe goes inactive until the occurrence of an access signal by the DRAM and before the next column/row information may be strobed into the DRAM and arises from the requirement to fully charge the various devices within the DRAM following the occurrence of a first memory access and before the next subsequent memory access. If allowance is not made for the precharge time, the data which the CPU attempts to either read from or write into the DRAM may be lost.

To address this DRAM operating limitation, prior art approaches have made use of the leading edge of the READ/WRITE pulse to initiate the start of an access cycle and to generate subsequent DRAM timing signals using fixed time delays from the leading edge of the READ/WRITE pulse. This approach allows the end of the RAS pulse to occur before the end of the READ/WRITE pulse and permits the RAS precharge time to be accommodated. However, this solution does not eliminate the problem since the CAS signal may now terminate before the end of the READ/WRITE pulse resulting in invalid data being available when the CPU requires it.

This is best shown in FIG. 1 which illustrates the timing of the various aforementioned signals in a prior art data processing system. With all of the sgnals being active low, a memory access cycle is initiated by the leading edge of a READ pulse which occurs at time $t_o$. Following a predetermined interval $t_1$ as determined by a DRAM controller, a RAS pulse is provided to the DRAM for designating the row address from which data is to be read from the DRAM. Following a second time interval after the occurrence of the leading edge of the RAS pulse $(t_2 - t_1)$, a CAS pulse is provided to the DRAM for designating the column address from which the desired data is to be read. During the CAS pulse, the data is read by the CPU from a given location in the DRAM. In the aforementioned prior art approach, the end of the CAS pulse could occur before the end of the READ pulse. However, with the CAS pulse and thus the time during which valid data is available for reading from the DRAM by the CPU terminating at time $t_4$ and thus prior to the end of the READ pulse at $t_5$, the CAS signal ends before the end of the READ pulse and thus data could be invalid when the CPU requires it.

This problem has been addressed in the prior art by the use of latches coupled between the DRAM and CPU for latching data at the end of the CAS pulse so that the data at the DRAM need not be valid at the end of an access cycle since it is latched by external components. Once latched, the data is then provided to the CPU. These latching components, however, increase data processing system complexity as well as its cost and require additional printed circuit PC board surface area for mounting in an environment where space is always at a premium.

In addition, with the aforementioned latches introducing a fixed delay following the leading edge of the READ/WRITE pulse in generating subsequent DRAM timing signals, signal timing problems may occur when the DRAM is accessed in turn by two or more devices having different operating speeds. For example, the DRAM may be accessed by a CPU, a DMA controller, an I/O processor, etc., all of which may have different characteristic operating speeds. With the aforementioned fixed delay established by the speed of the fastest memory access device, which typically is the main processor or CPU, improper timing between the READ/WRITE pulse and the RAS and CAS pulses may occur when one of the memory access devices for which the fixed delay is not optimized is accessing the DRAM resulting in the reading of invalid data into the DRAM.

The present invention overcomes the aforementioned limitations of prior art approaches by allowing for the transfer of data between a plurality of memory access devices each having a different characteristic operating speed and a high speed DRAM up to the end of a memory access cycle without the use of external data latches so as to prevent the loss of valid data.

OBJECTS OF THE INVENTION

Accordingly, it is an object of the present invention to facilitate the reading of data from a DRAM.

It is another object of the present invention to provide for the direct read-out of data from a DRAM to a CPU in a data processing system without the use of latches or other temporary data storage means.

Still another object of the present invention is to simplify and reduce the cost of a data processing system having a DRAM into which data is written, or stored, and from which data is retrieved, or read.

A further object of the present invention is to provide a memory control signal to a DRAM which dynamically extends to the end of a memory access cycle allowing data to be read from the DRAM up to the termination of the memory access cycle.

Yet another object of the present invention is to provide proper timed operation between a high speed DRAM and a plurality of memory access devices having various characteristic operating speeds.

A still further object of the present invention is to provide in a data processing system a memory control signal, the duration of which varies with the amount of data to be read from a DRAM in the system.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, in which:

DETAILED DESCRIPTION OF THE PREFERRED EMBODIMENT

Figure 1:
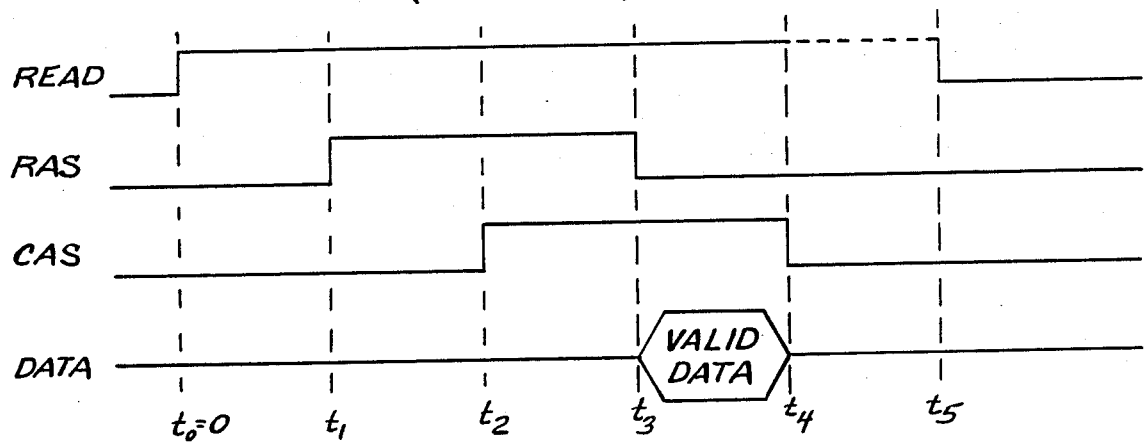
FIG. 1 is a time chart illustrating the occurrence of various signals in a prior art data processing system in reading data from a DRAM therein.
Figure 2:
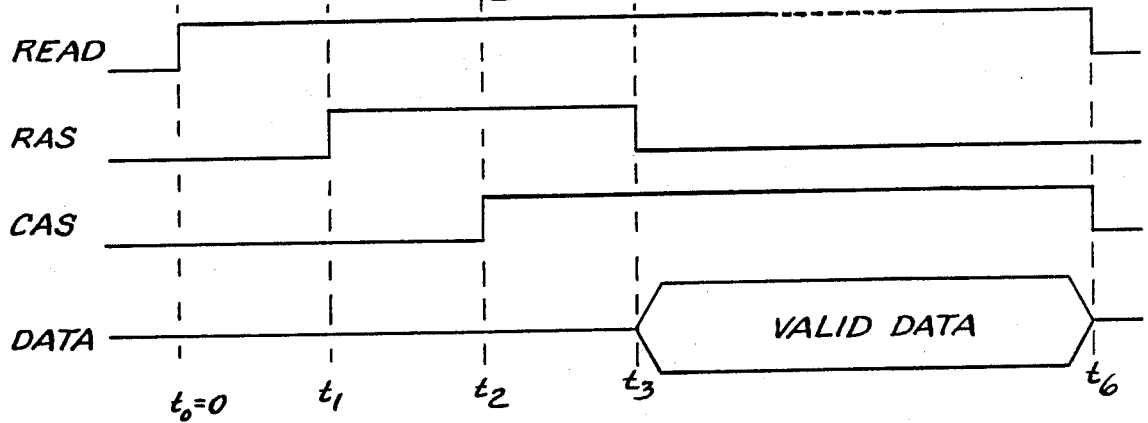
FIG. 2 is a time chart illustrating the occurrence of various signals in a data processing system in reading data from a DRAM in the system in accordance with the principles of the present invention.
Figure 3:
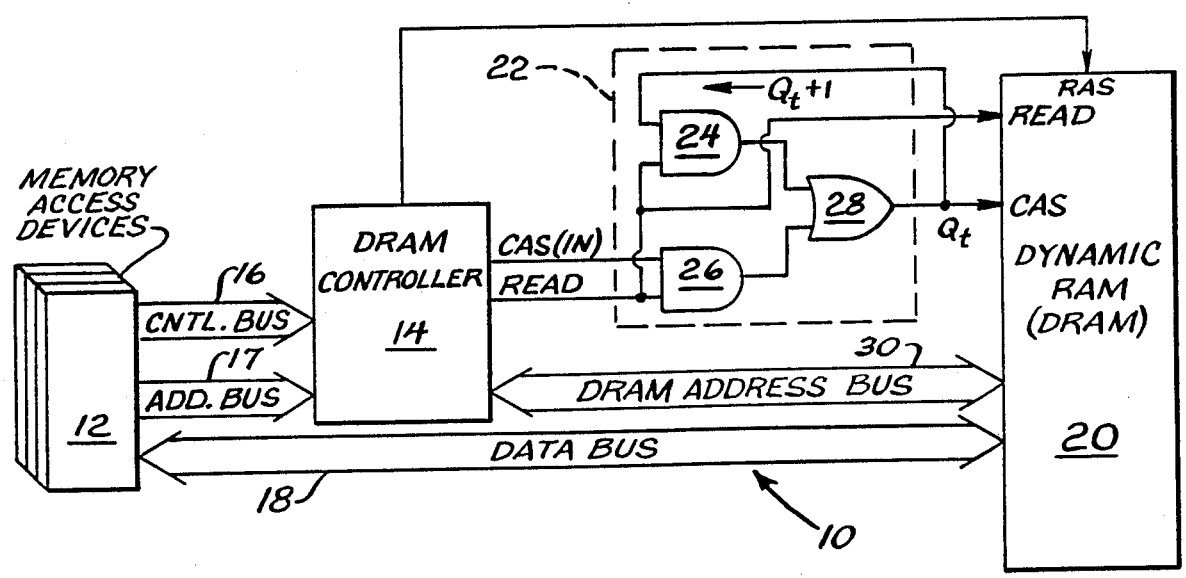
FIG. 3 is a simplified schematic diagram of a system for generating a dynamic CAS pulse for accessing and reading data from a DRAM in accordance with the present invention.

Referring to FIGS. 2 and 3, there are respectively shown the timing of various signals in and a schematic representation of a data processing system 10 for generating a dynamic CAS pulse in accordance with the principles of the present invention.

The data processing system 10 includes a plurality of memory access devices 12, a DRAM controller 14, a dynamic CAS pulse generating circuit 22 and a DRAM 20. For simplicity, block 12 is referred to hereinafter as a single memory access device 12, it being understood that the present invention is intended to permit various memory access devices having different characteristic operating speeds to operate with a DRAM 20. The memory access device 12 controls the operation of the data processing system 10 by generating various operating cycles, typically on a timed basis, but also in some cases in a nonsynchronous manner. The memory access device 12 is responsive to instructions and data received from the DRAM 20 as well as possibly from a read only memory (ROM), which is not shown in FIG. 3 for simplicity. The memory access device 12 is capable of such operations as branching to error routines, processing interrupts originated by various peripheral devices (not shown), and performing diagnostic routines and arithmetic/logic operations as well as executing specific application programs. The data processing system 10 also typically includes a system bus (not shown) by means of which the memory access device 12 is coupled to various other data processing system components and subsystems. The memory access device 12 may operate either at high or low speeds as the present invention is intended to make a high speed DRAM operationally compatible with virtually any memory access device regardless of its operating speed. Some systems may include more than one memory access device, each of which operates at a different speed, and the present invention is particularly adapted for use in such a system in providing compatibility of the DRAM with the various memory access devices.

The memory access device 12 is capable of writing data into and reading data from the DRAM 20 via a bi-directional data bus 18. The memory access device 12, in response to instructions and data provided thereto, generates various control signals which are provided via a control bus 16 to the DRAM controller 14. In addition, the memory access device 12 provides address information to the DRAM controller 14 via an address bus 17 for identifying specific locations within the DRAM 20 which the memory access device seeks to access. The control bus 16 and the address bus 17 are unidirectional with control and address information flowing from the memory access device 12 to the DRAM controller 14.

The DRAM controller 14 responds to the signals on the control bus 16 and address bus 17 by providing a row address strobe (RAS) signal and a column address strobe (CAS) to the DRAM 20 in order to permit the memory access device 12 to access designated locations within the DRAM 20. In addition, the DRAM controller 14 processes the address information received from the memory access device 12 via the address bus 17 and provides this address information to the DRAM 20 via a DRAM address bus 30.

The DRAM controller 14, which may be conventional in design and operation, includes various timing and logic circuitry (not shown) which is responsive to the control and address signals received from the memory access device 12 for generating various timed control signals which are, in turn, provided to the DRAM 20. The signals output by the DRAM controller 14 to the DRAM 20 include the aforementioned RAS and CAS signals as well as a READ signal where a memory access device 12 seeks to read data from a given location in the DRAM. The RAS and CAS signals respectively prepare the DRAM 20 to receive row and column address information via an address bus 30 which uniquely identify each storage location in the DRAM 20. The row and column address information, RAS, and READ signals are provided directly to the DRAM 20 from the DRAM controller 14. The leading edge of the READ signal initiates a READ access cycle of the DRAM 20 by a memory access device 12 which occurs at time to as shown in FIG. 2. After a predetermined time delay following the providing of the READ signal to the DRAM 20 from the DRAM controller 14, the DRAM controller outputs a RAS signal at time $t_1$ to the DRAM. The time delay between the leading edges of the READ and RAS signals is determined by the logic and timing circuitry within the DRAM controller 14 and is dictated by various system operating parameters such as the operating speeds of the memory access device 12, the operating speed of the DRAM 20, the amount of data typically transferred via the data bus 18 between the memory access device and the DRAM, etc. After another predetermined time interval following the leading edge of the RAS signal, the DRAM controller 14 outputs a CAS(in) signal to the dynamic CAS pulse generating circuit 22. The CAS(in) signal represents a conventional CAS pulse with leading and trailing edges fixed with respect to the leading edges of the READ and RAS signals. The READ signal is also provided from the DRAM controller 14 to the dynamic CAS pulse generating circuit 22.

The dynamic CAS pulse generating circuit 22 includes a pair of AND gates 24 and 26 and an OR gate 28. The READ signal is provided to one input of each of the AND gates 24 and 26, while the CAS(in) signal is provided to one input of AND gate 26. Referring to the pulse timing diagrams of FIG. 2 as well as to the signal status information set forth in Table I, it can be seen that initially the READ and CAS(in) signals are inactive. This status of the READ and CAS(in) signals represents a state where no cycle is in progress as shown in the first row of Table I.

TABLE I

| READ | CAS(in) | $Q_{t+1}$ | $Q_{t(=CAS)}$ | STATUS |
|---|---|---|---|---|
| 0 | 0 | 0 | 0 | No cycle in progress. |
| 1 | 0 | 0 | 0 | Cycle not yet to CAS time. |
| 1 | 1 | 0 | 1 | Begin CAS at specified time. |
| 1 | 1 | 1 | 1 | Cycle in progress hold CAS. |
| 1 | 0 | 1 | 1 | Hold CAS until end of cycle. |
| 0 | 0 | 1 | 0 | End of cycle CAS will turn off. |
| 0 | 1 | 1 | 0 | End of cycle CAS will turn off. |

The memory access device 12 asserts a DRAM read cycle by providing appropriate control signals to the DRAM controller 14 resulting in the READ signal going active at time $t_o$ as shown in row 2 of Table I and the signal pulse diagrams of FIG. 2. The READ signal is also provided from the DRAM controller 14 to the DRAM 20. Next, after a predetermined time interval, the RAS signal goes inactive, followed by the CAS(in) signal going active after a second predetermined time interval, or at time $t_2$. With both the CAS(in) and READ signals active, AND gate 26 will provide an output to OR gate 28. OR gate 28, and thus the dynamic CAS pulse generating circuit 22, then provides a CAS signal to the DRAM 20 as shown in line 3 of Table I for the signal designated $Q_t$. In Table I, the $Q_t$ signal represents the output of the OR gate 28 at the instant a new input is applied, before the output is affected, while the $Q_{t+1}$ signal represents the output of the OR gate at a point in time when the output has reached stability due to the change in an input. $Q_t$ represents a dynamic CAS pulse provided by the dynamic CAS pulse generating circuit 22 to the DRAM 20, while $Q_{t+1}$ represents a change in $Q_t$ at some subsequent time which signal is fed back to one input of AND gate 24. In line 4 in Table I, the $Q_t$ signal is shown being provided from the OR gate 28 to one input of AND gate 24. When this occurs, all four signals represented in Table I are active and a READ cycle wherein data is read via the data bus 18 from the DRAM 20 by the memory access device 12 is in progress. Lines 3 and 4 in Table I occur virtually simultaneously and are merely shown as separate steps to illustrate the difference between initiation and continuation of a READ cycle. A valid CAS signal will continue to be provided to the DRAM 20 so long as the READ and CAS(in) or CAS(out) feedback signals provided from the DRAM controller 14 to the dynamic CAS pulse generating circuit 22 are maintained in an active state. So long as the CAS signal provided to the DRAM 20 is valid, or active, the memory access device 12 will continue to be able to read data via the data bus 18 from the DRAM 20.

When the memory access device 12 still seeks access to the DRAM 20, an appropriate control signal can be provided from the DRAM controller 14 via the control bus 16 resulting in the CAS(in) output from the DRAM controller going inactive as shown in line 5 of Table I. This transition of the CAS(in) input signal to the dynamic CAS pulse generating circuit 22 does not result in the immediate transition of the $Q_t$ (CAS) and $Q_{t+1}$ signals which remain high as shown in line 5 in Table I. When CAS(in) goes inactive, AND gate 26 will no longer provide an output to OR gate 28. However, with the READ signal still active, AND gate 24 will continue to provide an output to OR gate 28 since the $Q_{t+1}$ signal fed back to the other input of AND gate 24 remains active. Thus, the output of AND gate 24 will remain active until the READ signal goes inactive and OR gate 28 will continue to provide a CAS signal to the DRAM 20 so long as the READ signal remains active. When the memory access device 12 no longer seeks access to the DRAM 20, the control signal goes inactive, AND gate 24 will no longer provide an output to OR gate 28 and the CAS ($Q_t$) input to the DRAM 20 will go low corresponding to the end of a READ access cycle. In this manner, the CAS signal is extended out to the end of a READ access cycle to permit the memory access device 12 to read data from the DRAM 20 via the data bus 18 at any time during the READ access cycle following the leading edge of the CAS signal. Since the memory access device 12 is enabled to read valid data out to the end of a READ access cycle, there is no need to temporarily store the data in latches as in the prior art where a CAS cycle terminates before the end of a READ access cycle.

There has thus been shown an improved arrangement for enabling a memory access device to read data from a DRAM which allows for generating a dynamic column address strobe (CAS) signal, the trailing edge of which extends to the end of the read cycle. This permits the memory access device to read data from the DRAM up to the end of the read cycle permitting more data to be read by the memory access device. The trailing edge of the CAS signal is thus allowed to float in time and to function as a dynamic CAS pulse. This eliminates the need to temporarily latch data from the DRAM for subsequent tansmission to the memory access device since the dynamic CAS pulse will remain valid until the end of the READ pulse regardless of the length of the READ pulse, thus holding the valid data at the DRAM until the memory access device is prepared to read it.

To provide the CAS pulse with a floating trailing edge, the output of a dynamic CAS pulse generating circuit is not only provided to the DRAM as a CAS signal, but is also fed back to interact with the memory access (READ) signal and the CAS input signal from a DRAM controller to ensure that the CAS signal extends out to the end of and does not terminate prior to termination of the memory access signal. This arrangement also permits DRAMs having fast access times to be compatible with relatively slow memory access devices in transferring data therebetween. The present invention also has application where there is more than one memory access device in the data processing system. For example, the system may include a fast central processor with which the memory is designed to operate at full speed as well as a slower temporary master processor, such as used in direct memory access, which only needs to be fast enough to take data off of a mechanically rotating disk. The present invention allows the memory to operate equally well with both the higher and lower speed memory access devices in an efficient manner.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. In a data processing system having a dynamic random access memory (DRAM) and a plurality of memory access devices each having a characteristic operating speed, wherein a memory access device outputs control signals for accessing said DRAM and reading data therefrom during a read cycle, a system for maintaining DRAM access by a memory access device until termination of said read cycle comprising:

control means coupled to the DRAM and said memory access devices and responsive to the control signals output by a memory access device for providing a READ signal to the DRAM, wherein said READ signal is characterized as having a leading edge defining the start of said read cycle and a trailing edge defining the end of said read cycle and wherein said READ signal varies in length in accordance with the duration of said read cycle, said control means further outputting first and second address strobe signals of fixed length having leading and trailing edges fixed in time with respect to the leading edge of said READ signal;

circuit means coupled to said DRAM and further coupled to said control means and responsive to said READ and second address strobe signals for providing a third address strobe signal to said DRAM, wherein said third address strobe signal is of variable length and includes a leading edge fixed in time with respect to the leading edge of said READ signal and a trailing edge coincident with the trailing edge of said READ signal for providing address information to said DRAM until the end of a read cycle; and feedback means for comparing the occurrence of said third variable length address strobe signal with the occurrences of said READ signal and said second address strobe signal and for outputting said third variable length signal after said second address strobe signal terminates and so long as said READ signal is asserted.

2. The system of claim 1 wherein said circuit means includes a plurality of logic gates responsive to said second fixed length address strobe signal for initiating said third variable length address strobe signal, wherein said plurality of logic gates is further responsive to said READ signal for continuing said third variable length address strobe signal until the end of said read cycle.

3. The system of claim 2 wherein said first fixed length and said second fixed length address strobe signals are respectively row address strobe (RAS) and column address strobe (CAS) signals and said third variable length signal represents a variable length CAS signal.

4. The system of claim 3 wherein said RAS and said variable length CAS signals provided to the DRAM designate a data storage location in the DRAM in reading data therefrom.

5. The system of claim 1 further comprising an address bus coupled between said control means and said DRAM by means of which said control means provides address information to said DRAM.

6. The system of claim 1 further comprising a data bus coupled to said memory access devices and to the DRAM for transmitting data therebetween.

* * * * *